United States Patent [19]
Weyburne et al.

[11] Patent Number: 6,048,742
[45] Date of Patent: Apr. 11, 2000

[54] PROCESS FOR MEASURING THE THICKNESS AND COMPOSITION OF THIN SEMICONDUCTOR FILMS DEPOSITED ON SEMICONDUCTOR WAFERS

[75] Inventors: David W. Weyburne, Maynard; Qing S. Paduano, Arlington, both of Mass.

[73] Assignee: The United States of America as represented by the Secretary of the Air Force, Washington, D.C.

[21] Appl. No.: 09/035,573

[22] Filed: Feb. 26, 1998

[51] Int. Cl.[7] ................................................ H01L 21/00
[52] U.S. Cl. ................................ 438/7; 438/16; 438/29
[58] Field of Search .................................... 438/7, 16, 31, 438/29; 356/381

[56] References Cited

U.S. PATENT DOCUMENTS

| | | | |
|---|---|---|---|
| 5,166,080 | 11/1992 | Schietinger et al. | 438/7 |
| 5,232,547 | 8/1993 | Drowley et al. | 117/55 |
| 5,443,684 | 8/1995 | Eckart et al. | 438/16 |
| 5,835,226 | 11/1998 | Berman et al. | 356/382 |

OTHER PUBLICATIONS

H.A. MacLeod, Thin–Film Optical Filters (American Elsevier Publishing Company, New York, 1969) pp. 94 to 100.

Q.S. Paduano, D.W. Weyburne, F. Lu and R. Bhat, J. Elec. Mat., 24, 1659 (1995).

*Primary Examiner*—John F. Niebling
*Assistant Examiner*—John Murphy
*Attorney, Agent, or Firm*—Stanton E. Collier

[57] ABSTRACT

The invention works by taking optical reflectance measurements on the deposited layers at different wavelengths and fitting the measured results to extract the thicknesses and compositions. The process of the present invention simultaneously measures the thicknesses of elemental and binary semiconductors' layers and the thicknesses and composition of ternary layers. Highly precise thickness and composition estimates and wafer maps of the growth rates and composition are provided by (1) measuring in a wavelength range at which the index of refractions are rapidly varying and (2) growing a special high reflectance test structure consisting of alternating layers of the materials to be measured.

10 Claims, 4 Drawing Sheets

PROCESS FOR MEASURING THE THICKNESS AND COMPOSITION OF THIN SEMICONDUCTOR FILMS DEPOSITED ON SEMICONDUCTOR WAFERS

STATEMENT REGARDING FEDERALLY SPONSORED RESEARCH OR DEVELOPMENT

The invention described herein may be manufactured and used by or for the Government for governmental purposes without the payment of any royalty thereon.

CROSS-REFERENCES TO RELATED PATENT APPLICATIONS

None are cited.

BACKGROUND OF THE INVENTION

The present invention relates to the manufacture of semiconductor wafers, and, in particular, relates to the properties of thin films placed thereon.

High performance Gallium Arsenide (GaAs) and Indium Phosphide based device manufacture is increasingly being driven by epitaxial growth issues. In order to obtain good reproducibility, epilayer growth systems need periodic calibration of the growth rates (obtained as thickness divided by growth time) and of the ternary composition values. A characterization process that takes too much time, money or manpower obtaining the calibration results is not going to be used as much as the epitaxial layer grower would want.

Uniformity optimization is a second area in which the characterization process can have a significant impact. Large area epilayer uniformity is a major performance objective for epitaxial layer growth systems since it directly affects device yield. However, the epitaxial layer growers have had few choices for obtaining epilayer uniformity data in a timely fashion. Thickness and composition mapping by traditional methods are either destructive, labor intensive and/or very time consuming. Therefore, growers generally have had to rely on very limited mapping, if any, in order to try to optimize uniformity for a given process.

The present invention describes a new characterization process that measures the thickness and composition of epitaxial layers of semiconductor films. It is based on an optical characterization technique called spectroreflectance, also called optical reflectance spectroscopy. It is a technique that is widely used to measure the thickness of thin layers deposited onto a substrate. For example, spectroreflectance is used routinely in the optical coating industry to characterize the coatings deposited on lenses, mirrors, etc. After thin film deposition by a suitable deposition process, for example, chemical vapor deposition, the reflectance wavelength spectrum of the sample is then measured in a spectroreflectance apparatus. The reflectance spectrum is then numerically fitted on a computer to extract the thicknesses (growth rates) of the layer, or multiple layers, making up the deposited film.

In the spectroreflectance technique, a light beam is directed at the sample's surface and the specularly reflected light intensity is measured as a function of wavelength. The index of refraction change that occurs at each of the interfaces between the deposited layers causes a portion of the entering light to be reflected. The multiple reflected beams combine at the detector and result in constructive or destructive interference. A wavelength scan of a single layer structure having a different index of refraction than the substrate, for example, will show maxima/minima at $\lambda/4n$, $3\lambda/4n$, $5\lambda/4n$, ..., where n is the index of refraction of the deposited film and $\lambda$ is the wavelength of the measuring light. For multiple layer structures, it is possible to fit the reflectance spectrum to a well-known optical model called the transfer-matrix model, also called the characteristic matrix model. The model requires that one knows the layer sequence of the deposited layers and the index of refraction as a function of wavelength of each of the deposited layers. The result of the fitting procedure, as it has been normally applied in the past for semiconductor films, is the thicknesses of each of the layers.

Spectroreflectance has been used for measuring semiconductor epitaxial layers of silicon and GaAs since the early 1960's. In this case the doping of the layers provides enough of a change in the refractive index compared to the substrate to cause the interference effects seen in the reflectance spectrum. The technique was extended to extract other Group III, Group V (III–V) semiconductor thicknesses. In these systems, the refractive index differences result from differences in the materials themselves rather than from a doping effect.

Recently, the spectroreflectance was used to wafer map the layer thicknesses precisely. The key to the high precision is the growth of a Fabry-Perot (FP) test structure. The FP structure used for thickness characterization consists of multiple pairs of Aluminum Arsenide (AlAs)/GaAs grown on a GaAs wafer and topped off with a GaAs cavity layer. The top mirror in this case is the air/GaAs interface. This type of FP structure is known to be highly sensitive to the stack and cavity thicknesses. The results of Paduano and Weyburne in J. Elec. Mat., 24, 1659 (1995) indicate that the spectroreflectivity technique can measure the variation in thickness down to better than ±0.1% (~one atomic layer) on a typical cavity thickness of ~300 nanometers (nm).

While the spectroreflectance technique has been very successful for extracting thicknesses, relatively little work has been carried out for deducing ternary composition using reflectance spectroscopy. One group was able to use spectroreflectivity to measure the aluminum gallium arsenide (AlGaAs) composition in a vertical cavity laser structure. However, they had to start the fitting procedure using the thickness obtained by scanning electron microscope measurement and the composition obtained from a photoluminescence measurement. Similarly, others have used spectroreflectance measurements to obtain composition of a simple AlGaAs/GaAs structure but, when calculating the reflectivity for a more complicated Bragg stack, they kept the composition constant. Prior work by Tarof, et. al. was able to extract the composition for a simple one or two layer, one composition indium phosphide based ternary structure using an analytical expression that relates modulation amplitude of the reflectance to the thickness and composition of the epitaxial layers.

One of the reasons there has not been more effort in extracting the ternary composition as well as the thickness using spectroreflectance is the perceived coupling problem. In the spectroreflectance technique, it is the optical thickness given by n*d, where n is the index of refraction, which is composition dependent, and d is the actual deposited layer thickness. Thus composition and the thickness are coupled in the sense that by increasing n and decreasing d, for example, the measured optical thickness remains the same. The coupling becomes a problem since, in certain experimental conditions, n and d are essentially constants. For example, many of the early optical reflectivity measurements were done in spectrophotometers with reflectance apparatus in the 2,000–20,000 nm range. In this wavelength range, the index of refraction of GaAs and AlGaAs is slowly varying. For example, in the range 5,000 to 20,000 nm, $Al_{.3}Ga_{.7}As$ average index of refraction variation is $1.6 \times 10^{-5}$/nm. The index of refraction can be experimentally determined to 3–4 decimal places. Thus both n and d are nearly constants over 1,000 nm wide wavelength ranges. This makes it possible to obtain a whole set of n's and d's that give the same optical thickness.

Thus, there exists a need for a process of measuring the thickness and composition of semiconductor thin films deposited epitaxially on semiconductor wafers.

SUMMARY OF THE INVENTION

The process of the present invention is intended to be used to measure thickness and composition of binary and ternary semiconductor thin films deposited epitaxially on semiconductor wafers.

The invention works by taking spectroreflectance measurements on the deposited layers at different wavelengths and fitting the measured results to extract the thicknesses and compositions. The process of the present invention simultaneously measures the thickness of elemental and binary semiconductors' layers and the thickness and composition of ternary layers. Thickness and composition estimates and wafer maps of the thickness and composition are provided, primarily, by measuring the spectroreflectance in a wavelength range in which there is a significant variation of the index of refraction of a least one of the materials in the film or substrate. The variation in the index of refraction insures that the optical thickness, given by the product of the index of refraction and the layer thickness, will not be coupled in the wavelength range of the measurement. The amount of variation required to accomplish this decoupling will depend on a number of factors including the materials being measured and the wavelength range being used for the measurement. The main test as to whether or not the decoupling is successful is whether the computer program performing the numerical fitting of the experimental data to the transfer matrix computer model crashes (or equivalent, e.g., program terminates with error message) or converges to obviously incorrect estimates.

A second important element of the present invention is the option of growing of a high reflectance test structure consisting of alternating layers of the materials to be measured. The high reflectance test structure has a smaller estimated error, $\Delta x$, on the extracted composition value, x, than a single layer will have. This invention describes how to pick a test structure that meets the requirements for general calibration purposes. In addition, the reflectance spectrum of the special test structure has spectral features in the spectroreflectance spectrum that the computer program, without operator intervention, can extract and use as good initial guesses for the fitting routine. This makes automated thickness and composition mapping possible.

Therefore, one object of the present invention is to provide a process that can simultaneously determine layer compositions and thicknesses of thin films.

Another object of the present invention is to provide a process for picking test structures that meet thickness and composition precision requirements.

Another object of the present invention is to provide a process amenable to automated thickness and composition wafer mapping by use of a special test structure that provides good initial guesses for the fitting routine directly from spectrum without operator intervention.

Another object of the present invention is to provide a process that reduces the cost and improves the yields of epitaxial layers deposited on semiconductor wafers for device purposes.

Another object of the present invention is to provide a process that reduces the cost and improves the yields of high electron mobility transistors (HEMTs) and heterojunction bipolar transistors (HBTs) devices.

Another object of the present invention is to provide a process that is rapid, low cost, nondestructive characterization technique for the manufacture of epitaxial-based devices.

Another object of the present invention is to provide a process that avoids the coupling problem between the composition and the thickness.

Another object of the present invention is to provide a process that is nondestructive in that the wafer can be repolished and reused.

Another object of the present invention is to provide a process that does not require any sample preparation.

These and many other objects and advantages of the present invention will be readily apparent to one skilled in the pertinent art from the following detailed description of a preferred embodiment of the invention and the related drawings.

DESCRIPTION OF THE PREFERRED EMBODIMENT

The purpose of the invention is to provide a method for precisely measuring the thickness (growth rate) of elemental and binary semiconductor's layers and the composition and thickness (growth rate) of ternary semiconductor layers deposited epitaxially onto semiconductor wafers. This information, in turn, is used to calibrate and/or optimize the thin film deposition machine used to deposit the layers. Once calibrated and/or optimized, the deposition system can then be used to grow the semiconductor device structures for which the deposition system was intended to be used. Systems that can be calibrated in this way include, for example, Metal Organic Chemical Vapor Deposition (MOCVD) systems and Molecular Beam Epitaxy (MBE) deposition systems.

Figure 1:
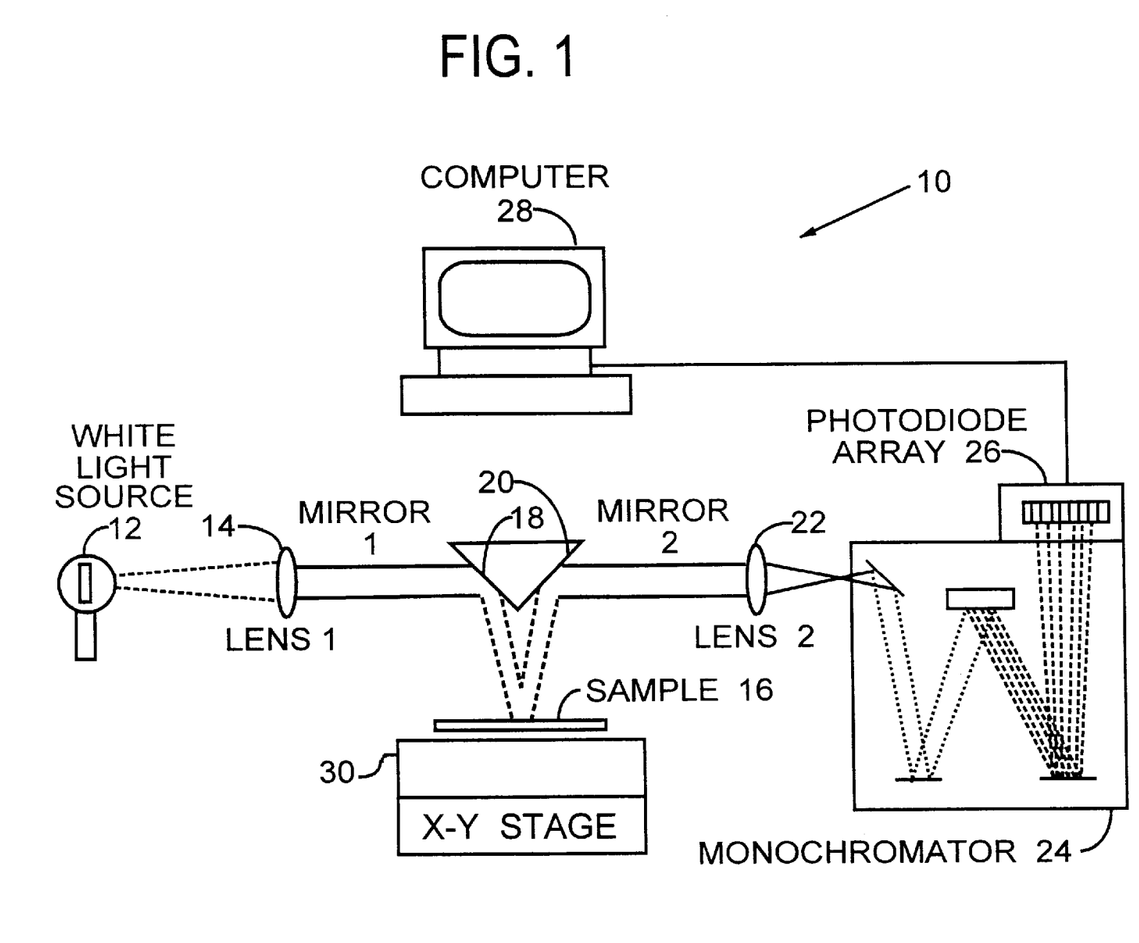
FIG. 1 illustrates by schematic diagram the apparatus used to measure reflectance.

FIG. 1 shows one possible implementation of a spectroreflectance apparatus utilizing a photodiode array. A spectroreflectance measuring apparatus 10 is shown that measures the reflectance from a sample wafer as a function of wavelength. The white light source 12 is collimated by lens 14 and reflected onto the sample 16 by mirror 18. Some of the light beam is reflected, and some of it is transmitted, at each of the layer interfaces of the sample, not shown. Mirror 20 directs the reflected light to lens 22 which focuses onto the slit opening of the monochromator 24. The monochromator 24 disperses the light onto the photodiode array 26. The measured light intensity at each pixel of the array 26 represents a different reflected wavelength. The computer 28 acquires the array's output. The present apparatus does not measure absolute reflectances in the sense that the light intensity throughput and detectivity of the detector is wavelength dependent. To get absolute reflectance values, spectroreflectance from a freshly deposited gold layer on a semiconductor wafer with numerical correction, not shown, is taken and used as the 100% reflectance standard. A computer program, not shown, normalizes the data and passes it to fitting program which then fits the reflected spectrum and outputs the thickness and composition values of the sample wafer. The X-Y stage 30 is used to move the sample 16 so multiple points can be measured thereon. Since this particular apparatus can take the spectrum at each point in about 1 second, it would be possible to create a wafer map of the thicknesses and compositions in a short period of time compared with the traditional mapping techniques.

Figure 3:
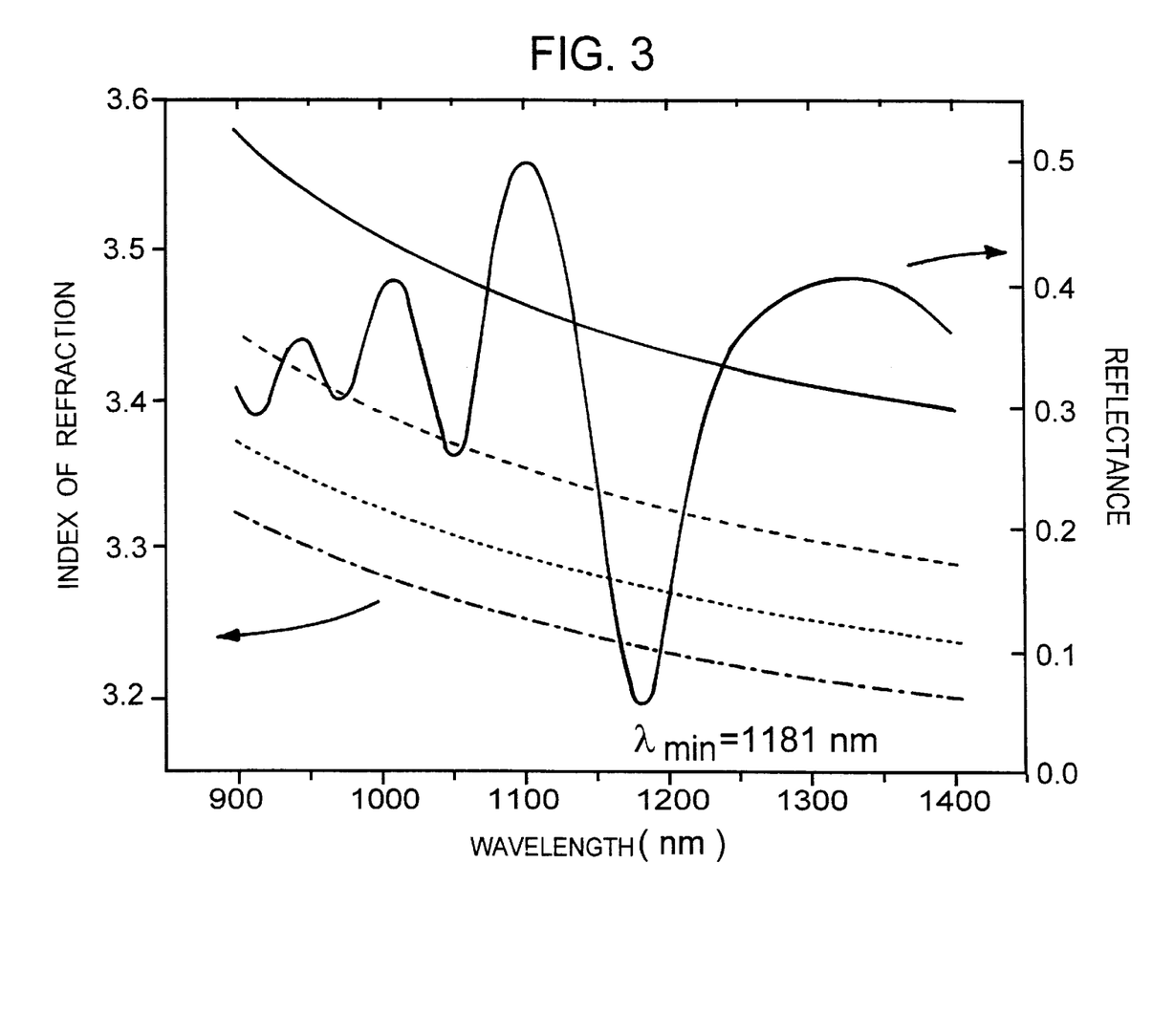
FIG. 3 illustrates by graph an actual spectroreflectance measurement of the structure of FIG. 2.

The Primary Key Element to this Invention Process is to avoid the optical thickness coupling problem discussed above. This is accomplished herein by configuring the spectroreflectance apparatus to measure the reflectance spectrum in a wavelength range in which the refractive indexes of at least one of the two materials is varies significantly. One range that this will always be true is in the range just above the band gap wavelength of the semiconductor material with the highest band gap wavelength. For the AlGaAs/GaAs case, both AlGaAs and GaAs indexes are rapidly varying just above GaAs's bandgap wavelength. In the range 900–1300 nm, for example, $Al_{.3}Ga_{.7}As$ average index of refraction variation, is $2.2 \times 10^{-4}$/nm, Palik, Handbook of Optical Constants of Solids, Academic Press (1985). This is a factor of 14 times higher than the variation in the 5000–20000 nm range. In FIG. 3 the index of refraction of GaAs and AlGaAs is plotted as a function of wavelength in the 900–1300 nm range. Plotted against the left axis are the index of refractions for GaAs (solid line), $Al_{.173}Ga_{.827}As$ (dashed line), $Al_{.264}Ga_{.736}As$ (dotted line) and $Al_{.35}Ga_{.65}As$ (dashed-dot line). It is clearly evident from FIG. 3 that the index of refraction is not a constant in this wavelength range. The rapid variation in index of refraction means that the optical thickness, given by index of refraction times the thickness, will not be coupled in this wavelength range.

Figure 2:
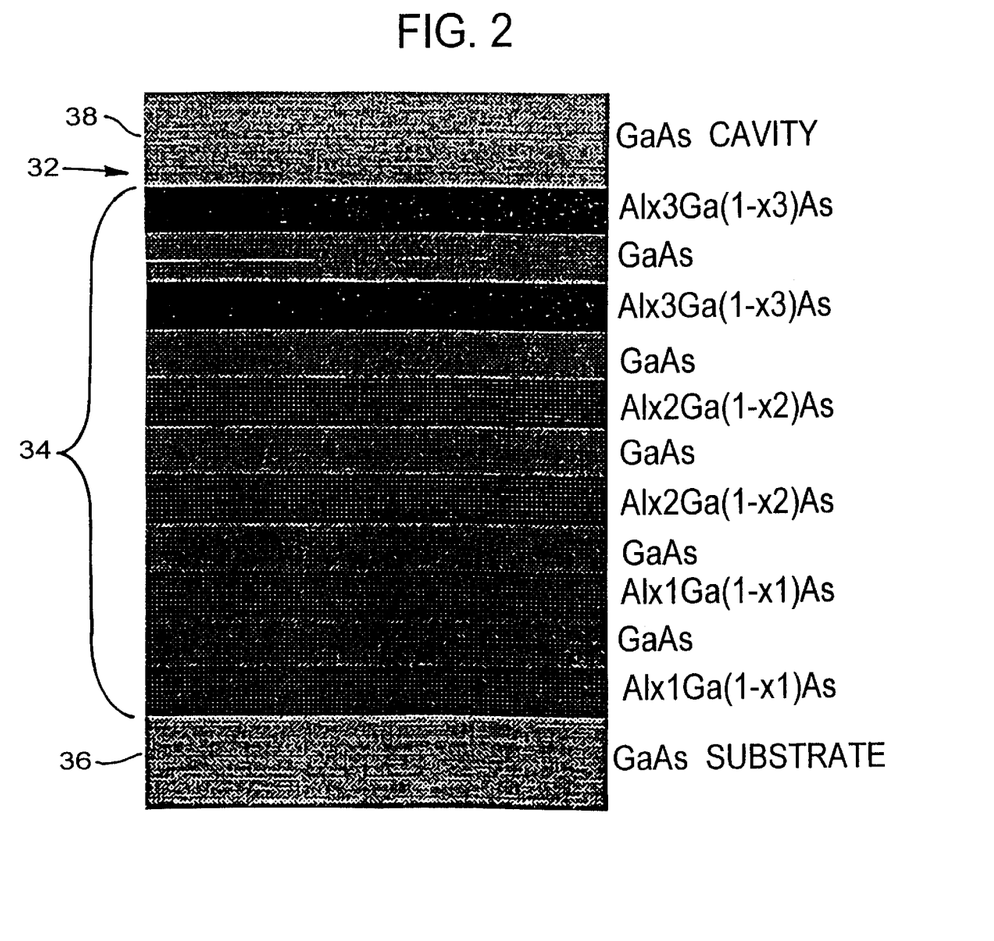
FIG. 2 illustrates a cross sectional view of the layered sequence of a Fabry-Perot test structure having 3 different compositions of AlGaAs.

To demonstrate this, a test structure was grown and the spectroreflectance was measured in this range. FIG. 2 illustrates this test structure schematically showing a cross sectional view of the layered sequence of a Fabry-Perot test structure having 3 different compositions of AlGaAs (not to scale). Plotted against the right axis of FIG. 3 is an example of an actual spectroreflectance measurement of a Fabry-Perot test structure having 3 different compositions of AlGaAs. Also plotted against the right axis is the results of the computer simulated reflectance spectrum using the thickness and composition parameters obtained by fitting the experimental curve with the appropriate transfer matrix model. The fitted spectrum in FIG. 3 is so close to the experimental curve that it is difficult to distinguish the plot as two separate curves. Also plotted against the left axis are the index of refraction for GaAs (solid line), $Al_{.173}Ga_{.827}As$ (dashed line), $Al_{.264}Ga_{.736}As$ (dotted line) and $Al_{.35}Ga_{.65}As$ (dashed-dot line).

The rapidly varying index of refraction also plays a key role in allowing for the wafer mapping of the thickness and composition. Because of the rapid variation, the fitting program can extract highly precise results using only a small wavelength range (~500 nm) and a small sample size (~100 points). The limiting factor in setting up a mapping system is the number of elements and wavelength range of commercially available photodiode arrays. Linear arrays manufactured out of silicon (0.2 to 1 μm range), germanium (0.8 to 1.8 μm range), indium gallium arsenide (0.8 to 1.6 μm and extended 1.2 to 2.4 μm), platinum silicide (1 to 5 μm range) covers the range of wavelengths likely to be needed to measure most semiconductor materials with the present invention. These arrays are readily available from a number of commercial suppliers. The number of elements ranges from 128 to 1024 depending on the detector material. The important part in picking the array size is to insure the correct wavelength range is covered. Because of the fixed distance between the individual detector elements in a commercial array, it may be necessary to purchase a larger array in order to cover the needed wavelength range. The additional points above 128 can be thrown away in order to keep the reflectance fitting time to a reasonable value. Fitting time depends primarily on the number of points fitted and the computer being used for the fits. By keeping the acquisition time and fitting times to less than 10 seconds, wafer mapping (20×20, 400 points) becomes a viable proposition.

A Second Key Element to this Invention Process is to grow and measure by spectroreflectance a high reflectance test structure to obtain highly precise semiconductor layer thickness and composition estimates and wafer maps. While the invention can be used to measure other structures, such as a single thick layers, the extracted thickness error bars, $\Delta d$, and especially the extracted composition error bars, $\Delta x$, will not be as small as the error bars obtained using a high reflectance test structures. The high reflectance test structures can be either a multi-layer Bragg reflector stack (described below) or a Fabry-Perot (FP) structure. The preferred test structure implementation is the FP test structure. The reason is that the reflectance spectrum of the FP structure has spectral features that make it possible for the computer program to extract initial guesses from the experimental spectrum that are needed to start the computer fitting procedure.

MacLeod in Thin-Film Optical Filters discusses the general properties of the all-dielectric FP structure of the type used in this invention. FIG. 2 illustrates one possible implementation of the FP test structure for the GaAs/AlGaAs system. The FP test structure 32 for the purpose of this invention consists of two reflectors separated by a cavity spacer. The bottom reflector, sometimes called a multi-layer Bragg reflector stack, consists of alternating layers of at least two semiconductor materials with different index of refractions. This reflector stack 34 is grown on the substrate wafer 36 or on a buffer layer grown on the substrate wafer (buffer layer must be the same material, doping type and doping level as the substrate wafer). The number of alternating layers can be from one to twenty or more. In general, the more layers, the higher the reflectance and the higher the precision with which the layer thickness and composition can be determined by this invention. However, the more layers grown, the longer the growth time. The trade-off then is to pick the fewest number of layers that meets the precision requirements of the application for which the invention is to be used. The thickness of the layers is chosen to give high reflectivity in a certain wavelength band. The layer thicknesses that give high reflectivity for a multiple pair high reflection mirror stack is given by $$n_1 d_1 + n_2 d_2 = \lambda_{center} / 2 \tag{1}$$

where $\lambda_{center}$ is the center of the first-order high-reflectance zone, $n_1$ and $n_2$ are the index of refractions of material 1 and 2 at wavelength $\lambda_{center}$, and $d_1$ and $d_2$ are the thicknesses of the two materials. MacLeod describes one particular implementation of this type of reflector in which the optical thickness of the two materials are equal, i.e., $n_1 d_1 = n_2 d_2$. For this particular case, the layers are said to be quarter-wave thick. Quarter-wave stacks are preferred for the purpose of this invention. However, there may be reasons to grow layers of different optical thicknesses if, for example, one material has a much smaller growth rate than the other. The second section of the FP structure consists of a cavity layer 38 grown on top of the bottom reflector. The thickness of this layer is given by $$n d = m \lambda_{center} / 2 \quad m = 1, 2, 3, \ldots \quad (2)$$

where n is the index of refraction of the cavity material at wavelength $\lambda_{center}$ and d is the layer thickness. For the purpose of this invention, any value of m is acceptable but the m=1 cavity layer will result in the shortest growth time.

The top reflector can be another multi-layer Bragg reflector or it can be just the air-cavity layer interface. Semiconductors in general have very large index of refractions compared to air. This results in high reflectivity for the semiconductor-air interface. For example, GaAs near the bandgap wavelength has a reflectivity of ~30% in air. Thus the air-cavity interface is one option for the top reflector. If, on the other hand, another multi-layer Bragg reflector is chosen as the top reflector, then the layer thicknesses for the top reflector must be the same, or nearly the same, as the bottom Bragg reflector discussed above. Otherwise the structure will not have the desired high reflectance needed for the precise determination of the compositions and thicknesses.

Therefore, possible high reflectance test structures that meet the requirements of the invention include: (1) a multi-layer Bragg reflector constructed of alternating layers of the materials to be characterized with the number of pairs from 1 to 20 or more, or (2) a FP test structure consisting of the multi-layer Bragg reflector (as described in 1), a cavity layer (described above) and the semiconductor-air interface as the top reflector, or (3) a top and bottom mirror consisting of the multi-layer Bragg reflector (as described in 1) and a cavity layer (described above). An example of the type of structure described in 1 above would be 7 pair $Al_{.3}Ga_{.7}As/GaAs$(85 nm/80 nm) where the thicknesses of the layers are given in parentheses. An example of the second type of structure would be 6 pair $Al_{.3}Ga_{.7}As/GaAs$(85 nm/80 nm)+ $Al_{.3}Ga_{.7}As/GaAs$(85 nm/160 nm). An example of the type of structure described in 3 above would be 3 pair $Al_{.3}Ga_{.7}As/GaAs$(85 nm/80 nm)+$Al_{.3}Ga_{.7}As/GaAs$(85 nm/160 nm)+3 pair $Al_{.3}Ga_{.7}As/GaAs$(85 nm/80 nm).

The high reflectance structures discussed above have high reflectivity in narrow wavelength ranges. In order to satisfy the Second Key Element to this Invention Process, we want to keep the entire high reflectance zone in the transparent range. The center of the high reflectance zone should be kept 1.5 to 2 high-reflectance-zone widths above the highest band gap wavelength. By keeping the center wavelength above the band gap, we avoid having to include the extinction coefficient of the materials in the fitting procedure. This not only simplifies the fitting but reduces the fitting time considerably.

To understand how the invention works, we will describe one implementation that we have actually constructed. To make the process as clear as possible, we will describe the making and using of our new invention hereinafter.

EXAMPLE #1

A 3-composition Aluminum Gallium Arsenide Process

Step #1

Select the materials to be characterized.

We begin by deciding to measure the thickness and composition of Aluminum Gallium Arsenide ($Al_x Ga_{1-x} As$ where x is the composition variable, $0 \leq x \leq 1$) layers grown on a commercially purchased GaAs wafer. Wherein, we regularly use three different AlGaAs composition layers in the course of his normal operations each week. We decide that we want to calibrate layers with composition value's $x_1$, $x_2$ and $X_3$. Because the special test structure that needs to be grown consists of alternating layers of two semiconductor materials having different index of refractions, we now need to decide on the second material. If we choose the second material to be the same as the wafer onto which the layers are grown, then we only need information on two refractive indexes as a function of wavelength and composition, in this case GaAs and AlGaAs. If on the other hand, we choose Indium Gallium Phosphide (InGaP) as the second material, for example, we would need information on all three refractive indexes as a function of wavelength and composition. Depending on the wavelength range at which the reflection measurements are made, the extinction coefficient as a function of wavelength and composition may also be required.

We decide to use GaAs as the second material.

Now we must decide whether the layers will be doped or undoped. While formulas do exist to account for the effects of doping on the index of refraction and the extinction coefficient, it adds an extra layer of complexity. Therefore, we decide to measure undoped layer thicknesses and compositions.

At this point we have decided on the AlGaAs/GaAs material combination and three target AlGaAs compositions $x_1 = 18\%$, $x_2 = 26\%$ and $x_3 = 36\%$.

Step #2

Select the Substrate that will be used.

For most of the semiconductor wafers that are commercially available, there are a number of options a buyer has that can effect the spectroreflectance measurements that are required in this invention process. Those options are the type of doping, the dopant level and the type of backside finish. Doped substrates can be used as long as the index of refraction as a function of wavelength is known or can be measured. The type of backside finish on a wafer commonly comes in two options, double-side polish or single-side polish. In the double-side polish wafers, both sides are polished to mirror-type finish. During reflection measurements off the top-side of the wafer, some of the light that does not become reflected is transmitted to the backside. This results in incoherent light reflections off the bottom side that make it back to the detector. This effect can and must be accounted for in the reflectance fitting program used in this invention. For single-side polish substrates, the back-side is rough which causes the transmitted beam to be diffusely scattered. This situation does not require any reflectance fitting equation corrections.

We decide to use undoped, single-side polished GaAs wafers for the purpose of this calibration.

Step #3

Select the precision to which the composition and thicknesses are to be measured.

We next examine the application for which the AlGaAs layers are used and we determine that the compositions of the AlGaAs must be within $\pm \Delta x_1$, $\pm \Delta x_2$ and $\pm \Delta x_3$ of the targeted values. Furthermore, we determine that the growth rates of the AlGaAs and GaAs layers should known to within $\pm \Delta d_{x_1}$, $\pm \Delta d_{x_2}$, $\pm \Delta d_{x_3}$ and $\pm \Delta d_1$ (where GaAs is denoted with a 1).

Step #4

Determine the thickness of the layers to be used in the FP test structure.

The thickness of the layers follows the general rules outlined above. Since there are no reasons to choose otherwise, we decide to grow all the layers quarter-wave, i.e., $$d_1 = \lambda_{center}/4n_1 \quad (3)$$

and $$d_{x_1} = \lambda_{center}/4n_{x_1}, d_{x_2} = \lambda_{center}/4n_{x_2} \text{ and } d_{x_3} = \lambda_{center}/4n_{x_3} \quad (4)$$

where the index of refractions $n_{x_1}$, $n_{x_2}$ and $n_{x_3}$ are evaluated at $\lambda_{center}$.

To keep things simple, we make the cavity layer material GaAs and the thickness of the layer to be $2*d_1$, where $d_1$ is calculated according to Eqn. 3.

The top reflector can be another multi-layer Bragg reflector or it can be just the air-cavity layer interface. We decide that if another multi-layer Bragg reflector is going to be used, then for simplicity, the layer thicknesses will be the same as the bottom reflector.

At this point of the process, we have chosen the thicknesses but have not yet decided on values for $\lambda_{center}$ or the actual high reflectance structure that will be used.

Step #5

Choose the center wavelength for the test structure.

The second key tenant in the present invention is to choose the center wavelength to be in a wavelength range in which the refractive indexes are rapidly varying. One range that this will always be true is in the range just above the band gap wavelength of the semiconductor material with the highest band gap wavelength. For the two materials that we have selected, GaAs has the highest wavelength band gap at ~873 nm at room temperature. We therefore want $\lambda_{center}$ to be above this wavelength. How far above this wavelength depends on the width of the high reflectance area around $\lambda_{center}$. There is an approximate formula for calculating the width for a multi-layer Bragg reflector structure like the one we are using. This formula is not very accurate, however, for structures with only a few layers. Instead, we use the computer to generate some plots of likely high reflectance structures using the appropriate transfer matrix model.

We go ahead and generate some plots of likely high reflectance structures based on the guidelines given above. The invention works best if we keep $\lambda_{center}$ between 1.5 and 2 widths above the band gap wavelength. From the computer plots for the various test structures, this corresponds to $\lambda_{center}$~1100 nm. To insure that the entire high reflectance zone is measured, the invention requires that the reflectance be measured $\pm 1.5$–2 widths from $\lambda_{center}$ which means in this case from ~900 to ~1400 nm. At this point we have chosen $\lambda_{center}$=1100 nm and the measurement wavelength of 900–1400 nm.

Step #6

Verify that the index of refraction and, if applicable the extinction coefficient, data are available for the specified wavelength range.

Extraction of the thickness and composition values using spectroreflectance requires the index of refraction and, if applicable the extinction coefficient, data for each composition at each wavelength. It is possible to use tabulated data and interpolate and/or extrapolate data as needed in the fitting program. A second possibility is to use analytical models that are obtained by fitting the tabulated data. A third possibility is to use semi-empirical damped harmonic oscillator models. The advantage of the last two analytical approaches is that the analytical equations are easily implemented into the computer fitting routines.

We check the literature and find that there are multiple sources of formulas for the index of refraction as a function of composition and wavelength for AlGaAs and GaAs. We decide to use the index of refraction formula developed by the two inventors, Paduano and Weyburne, for this material system. It is given by $$n_{AlGaAs} = \left[ A(x) + \frac{B(x)}{1 - \frac{C(x)}{\lambda^2}} \right]^2 \quad (5)$$

$A(x)=7.1-24.56x+21.6x^2$ where for $\lambda$ in nm $$B(x)=3.78+20.18x-18.4x^2 \quad (6)$$

$C(x)=(2.7-8.33x+10.3x^2)\times 10^5$

The formula is valid for GaAs and $Al_xGa_{1-x}As$ in the range $0 \leq x \leq 0.45$ and the wavelength range 900–1400 nm.

If one can not locate adequate tabulated data or analytical formulas for the index of refraction and, if applicable the extinction coefficient, for each composition at each wavelength, then the options are: 1) go back to Step 5 and pick a new $\lambda_{center}$ for which data is available or 2) measure, or have measured, the required index and/or extinction coefficient data. Option 2 is preferred since it keeps $\lambda_{center}$ in the preferred range.

Step #7

Choose the final high reflectance test structure.

Next, we need to choose just one of the candidate structures that meets the error specification of Step 3 and that has as short a growth time as possible. If the epitaxial reactor is tied up doing a long growth run, then the reactor can not be used for the intended purpose of growing device layers. Because we have chosen $\lambda_{center}$ (Step 5), we can now calculate the approximate growth time of each layer from Eqns. 3 and 4 and growth rates taken from previous calibrations or from the literature.

Figure 4:
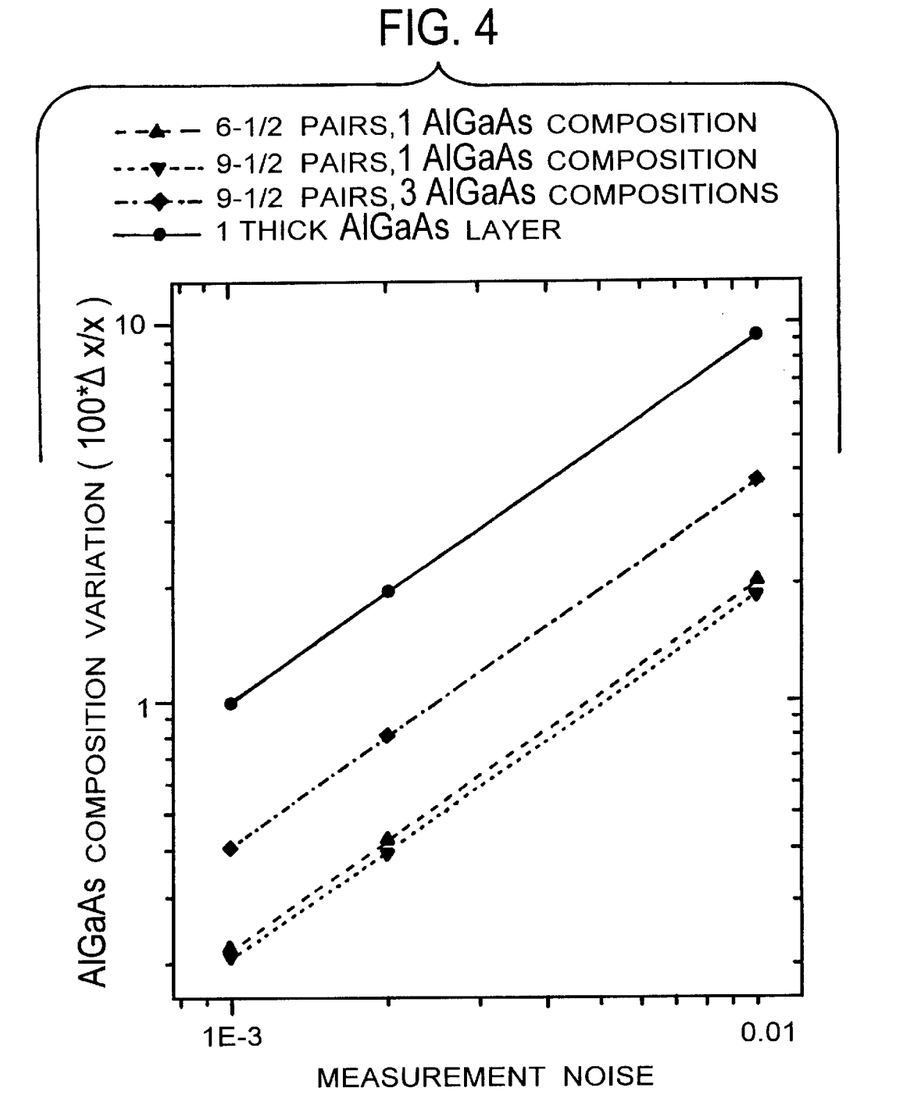
FIG. 4 illustrates by graph error estimates for AlGaAs compositions by Monte Carlo computer simulation.

At this point we can use the computer to generate error estimates to determine the reflectance structure that meets the requirements for precision that were determined in Step 3 above. A Monte Carlo simulation procedure can be used for generating error estimates (also called confidence limits). The error estimates are generated by first constructing exact reflectivity data by the matrix transfer model for each candidate structure. We always include a single layer structure having just one composition of AlGaAs for comparison purposes. The next step is to draw random numbers from appropriate distributions (most likely normal distribution) so as to mimic as close as possible measurement errors in the experimental apparatus that will be used to take the reflectance measurements. This is added to the exact data. This is divided the simulated system response function obtained by fitting the spectroreflectance from a gold reference mirror to a polynomial function in wavelength. This fitted system response function also has added noise to simulate the real response. This normalized data is passed to the appropriate transfer matrix model fitting procedure. One possible fitting procedure can be constructed using the Levenberg-Marquardt nonlinear least-squares method Press et al., Numerical Recipes, Cambridge University Press (1986). The fitting program is started by adding various amounts of uniform random numbers to the exact parameters, typically ±5% to ±90%. This insures that the fitting results are not dependent on the initial guesses. For each type of structure, this process is repeated 1000 times. The fitting results for each thickness and composition are then plotted as a histogram. The histogram data for each composition and thickness will follow a Gaussian-like distribution with the mean value being the parameter estimate and the standard deviation being the error estimate. It is convention to describe the error estimate, $\Delta d_1$ for example, as plus or minus twice the histograms standard deviation. This error estimate therefore represents the expected error one will obtain from fitting the reflectance from a real test structure. An example of the error simulation results of a number of high reflectance test structures is plotted in FIG. 4. For the spectroreflectance apparatus we used, the noise level is about ±0.2% of full scale(FS) for the measurements we made. In FIG. 4, the 6½ and 9½ pair stack with cavity consisted of pairs of a 82 nm GaAs layer on a 85 nm AlGaAs (30% Al) layer with a 328 nm cavity layer. The one layer consists of a 1520 nm AlGaAs layer (25% Al) layer. The three composition stack is the same as the one described in FIG. 2.

One then compares the growth times, error estimates and error specification and decides which structure is optimal. For example, we may decide in this case on the 9-pair (each layer quarter-wave thick) bottom reflector and a half-wave thick cavity layer. For the top mirror, we decides to rely on the GaAs-air interface itself. Keeping $\lambda_{center}$~1100 nm, we arrive at the following thicknesses: 3 pair of 85 nm GaAs/75 nm $Al_{.18}Ga_{.82}As$ grown first on the substrate wafer, followed by 3 pair of 85 nm GaAs/88 nm $Al_{.26}Ga_{.74}As$, followed by 3 pair of 85 nm GaAs/100 nm $Al_{.36}Ga_{.64}As$ and finally a 320 nm thick GaAs cavity layer.

Step #7

Grow the high reflectance structure in the machine to be calibrated/optimized.

The purpose of the invention is to provide a method for precisely measuring the growth rates of elemental and binary semiconductors layers and the composition and growth rates of ternary semiconductor layers deposited epitaxially onto semiconductor wafers. The growth rates in this case are determined as the thickness divided by the growth time. This information, in turn, is used to calibrate and/or optimize the thin film deposition machine used to deposit the layers. At this point it is time to grow the high reflectance test structure designed in Steps #1 to #6 in the deposition system that is to be calibrated/optimized. We go ahead and grow the selected structure.

Step #8

Measure the spectroreflectance from the grown high reflectance structure.

Now that the high reflectance structure is grown, it is time to measure the structure's spectroreflectance. This can be accomplished in a number of ways. One way to do this is to use a commercial spectrophotometer system with a reflectance attachment (for example a Lambda 19 system from Perkin-Elmer Corp., Norwalk Conn.). A second possibility is to use a home-built system made by buying and assembling the individual pieces that make up a spectroreflectance system (see FIG. 1 for one possible implementation). In any case, the spot size of the light beam used for the measurement of the sample should be smaller than the expected size of any thickness or compositional spatial variation. This insures that the material being measured at any one spot is homogeneous. The sample should also be free of any cracks, haze or debris that would cause some of the light to be diffusely scattered. Spectroreflectance from the sample as used for the purpose of this invention must be completely specularly reflected. The spectroreflectance from a gold reference mirror is made at the same time. The gold reference mirror can be purchased or made by depositing a thick layer of gold onto a GaAs wafer similar to the GaAs being used to grow the test structures. The gold mirror data is numerically corrected to give a 100% reference standard. The spectroreflectance from the test structure is normalized by dividing the test structure data by the gold reflectance data on a wavelength by wavelength manner. An example of the spectroreflectance from a 3 composition FP test structure is plotted in FIG. 3.

Step #9

Fit the spectroreflectance data.

Now that the normalized spectroreflectance has been obtained, it is time to fit the reflectivity data. One possible fitting procedure can be constructed using the appropriate transfer matrix optical model and the Levenberg-Marquardt nonlinear least-squares method. The only adjustable parameters in the fitting function are the thicknesses and the compositions. The initial values for the spectrum fitting function can be estimated from the location of the cavity minimum (see FIG. 3). Assuming the cavity minimum corresponds to the half-wave thick layer wavelength, the GaAs growth rate can be estimated. Assuming the AlGaAs composition was the same as the targeted value, we can also estimate the AlGaAs thickness in the same way. The fitting program assumes that the growth rate and the composition of the grown layers did not vary over the growth run. The fitting program results are the thicknesses and compositions of the individual layers. From this we can calculate the growth rate and composition of the materials making up the layers.

At this point one is done. One now has the actual AlGaAs compositions and growth rates and can compare to the three targeted AlGaAs compositions and growth rates to see if the growth system is working properly. For the example above, the targeted values were 3 pair of 85 nm GaAs/75 nm $Al_{.18}Ga_{.82}As$ grown first on the substrate wafer, followed by 3 pair of 85 nm GaAs/88 nm $Al_{.26}Ga_{.74}As$, followed by 3 pair of 85 nm GaAs/100 nm $Al_{.36}Ga_{.64}As$ and finally a 320 nm thick GaAs cavity layer (see Step #6) and the fitted results were 3 pair $Al_{.173}Ga_{.827}As/GaAs(74.5$ nm/84 nm)+3 pair $Al_{.264}Ga_{.736}As/GaAs(88.6$ nm/84 nm)+3 pair $Al_{.35}Ga_{.65}As/GaAs(100.6$ nm/84 nm) and a 336.3 nm GaAs cavity. In addition to the AlGaAs information, one also has the GaAs growth rate.

The main advantages of our new invention over conventional methods are: 1) the invention can simultaneously determine at least 3 compositions and 4 thicknesses, 2) the invention uses a simple and low cost apparatus, 3) the invention is nondestructive (this means the wafer can be repolished and reused), 4) the invention does not require any sample preparation and 5) the invention apparatus is potentially very fast using a photodiode detector array apparatus making wafer mapping a viable proposition.

Clearly many modifications and variations of the present invention are possible in light of the above teachings and it is therefore understood, that within the inventive scope of the inventive concept, that the invention may be practiced otherwise than specifically claimed.

What is claimed is:

1. A process for obtaining precise semiconductor layer thickness and composition estimates and wafer maps for the purpose of calibrating and/or optimizing the operation of deposition systems, said process comprising the steps of:

selecting the materials and compositions of said materials to be characterized as thin films, and having functional data of index of refraction versus wavelength and composition;

selecting a substrate material;

selecting the precision of measurements of the composition and the thicknesses;

selecting the thickness of layers of said materials;

selecting the spectroreflectance wavelength measurement range, wherein said selecting the spectroreflectance wavelength range a center wavelength is selected to fall within a wavelength range in which the refractive index of at least one of the two materials is rapidly varying for the purpose of decoupling the index of refraction from the layer thickness;

verifying that the index of refraction and, the extinction coefficient data are available for the selected wavelength range;

selecting the reflectance test structure that meets the precision requirements;

growing the reflectance test structure;

measuring the spectroreflectance of the reflectance test structure;

normalizing the spectroreflectance using a reference standard; and fitting the spectroreflectance data to obtain the thicknesses and compositions.

2. A process as defined in claim 1 wherein the reflectance test structure is selected from the group consisting of a single thick layer, a multi-layer Bragg reflector stack and a Fabry-Perot structure.

3. A process as defined in claim 1 wherein the reflectance test structure is a Fabry-Perot structure.

4. A process as defined in claim 1 wherein the center wavelength is selected to be above the band gap wavelength of the semiconductor material with the highest band gap wavelength.

5. A process as defined in claim 1 wherein the selecting of the materials to be used as thin films includes whether the materials are doped or undoped.

6. A process as defined in claim 1 wherein the selecting of the substrate includes whether the substrate is doped or undoped.

7. A process as defined in claim 1 further including whether said substrate is single-side or double-side polished.

8. A process as defined in claim 1 wherein said process is usable in a metal organic chemical vapor deposition system and molecular beam epitaxy deposition systems.

9. A process as defined in claim 3 wherein said stack is a quarter-wave stack.

10. A process as defined in claim 4 wherein a center of a high reflectance zone is from about 1.5 to about 2 high-reflectance-zone widths above the highest bad gap wavelength.

* * * * *